United States Patent

Weckström

[11] Patent Number: 5,917,315
[45] Date of Patent: Jun. 29, 1999

[54] RECEIVER FOR SPECTRUM ANALYSIS

[75] Inventor: Mikko Weckström, Camberley, United Kingdom

[73] Assignee: Nokia Telecommunications OY, Espoo, Finland

[21] Appl. No.: 08/875,076

[22] PCT Filed: Jan. 17, 1996

[86] PCT No.: PCT/FI96/00037

§ 371 Date: Sep. 18, 1997

§ 102(e) Date: Sep. 18, 1997

[87] PCT Pub. No.: WO96/22540

PCT Pub. Date: Jul. 25, 1996

[30] Foreign Application Priority Data

Jan. 19, 1995 [FI] Finland ..................................... 950233

[51] Int. Cl.⁶ .................................................. G01R 23/16
[52] U.S. Cl. ..................................... 324/76.23; 324/76.26
[58] Field of Search .............................. 324/76.12, 76.19, 324/76.23, 76.26; 455/131, 147, 161.3, 164.1

[56] References Cited

U.S. PATENT DOCUMENTS

| | | | |
|---|---|---|---|
| 3,876,946 | 4/1975 | Le Clair et al. | 324/76.23 |
| 4,430,611 | 2/1984 | Boland | 324/76.19 |
| 4,607,215 | 8/1986 | Takano et al. | 324/76.23 |
| 5,262,957 | 11/1993 | Heam | 324/76.19 |
| 5,731,841 | 3/1998 | Rosenbaum | 348/463 |

FOREIGN PATENT DOCUMENTS

| | | |
|---|---|---|
| 370 639 | 5/1990 | European Pat. Off. . |
| 475 705 | 3/1992 | European Pat. Off. . |
| 29 48 330 | 7/1980 | Germany . |

*Primary Examiner*—Diep N. Do
*Attorney, Agent, or Firm*—Pillsbury Madison & Sutro LLP

[57] ABSTRACT

A receiver for spectrum analysis includes at least one mixer in which a radio frequency input signal to be measured is mixed with an oscillator frequency generated by a voltage-controlled oscillator. In a detector, the level of an input signal to be measured is detected, after the signal has been transferred onto a lower frequency. The use of a logarithmic amplifier may be avoided by directing the detected signal to a decision means, which, in response to a change in the level of the detected input signal, provides a control voltage proportional to the magnitude and the direction of the change. The voltage commands an adjustable attenuator to attenuate the signal to be measured so that the level of the detected input signal substantially remains constant. The attenuation of the attenuator measured in decibels is linearly dependent on the control voltage, so that the values of the control signal directly represent the amplitude values.

9 Claims, 2 Drawing Sheets

RECEIVER FOR SPECTRUM ANALYSIS

This application is the national phase of international application PCT/FI96/00037 filed Jan. 17, 1996 which designated the U.S.

FIELD OF THE INVENTION

This invention relates to a receiver which measures a spectrum of a radio-frequency input signal. The receiver includes a local oscillator signal generator, a mixer in which the input signal and the local oscillator signal are mixed to produce an intermediate frequency signal, and a detector which detects an envelope of the input signal that has been transferred onto the intermediate frequency.

BACKGROUND OF THE INVENTION

In spectrum analysis, energy distribution of an electric signal is studied as a function of frequency of a spectrum analyzer, which allows graphic representation of the amplitude as a function of frequency in a portion of the spectrum. The analyzer may be used as a sensitive receiver to measure attenuation, FM deviation, and frequency, as well as to study RF pulses. A simple spectrum analyzer is based on a superheterodyne receiver and an oscilloscope. In the receiver, the input signal is mixed in the mixer with a frequency obtained from a voltage-controlled oscillator. The control voltage of the oscillator is a saw-tooth voltage, whereby the frequency of the oscillator sweeps over a certain frequency range. An intermediate frequency signal, obtained as the mixing result, is amplified and detected. The detected signal, which is amplified in a video amplifier, is directed to the vertical deflection plates of a cathode-ray tube and the saw-tooth voltage is directed to the horizontal deflection plates. As a result, an amplitude is shown on a display as a function of frequency. In older spectrum analyzers, the detector and the video amplifier were combined in the same block.

FIG. 1 shows a simplified block diagram of a prior art spectrum analyzer primarily intended for monitoring. An incoming RF signal is attenuated in an attenuator 1, whereafter it is low-pass filtered in a filter 2 before mixing it in a mixer stage 3 with a oscillator frequency $f_2$. The oscillator frequency $f_2$ is generated in a YIG oscillator block A, which comprises an oscillator 4 and its control circuits 5, 6. The frequency $f_2$ of the YIG oscillator varies as a function of a ramp voltage obtained from a ramp generator 7, whereby the oscillator frequency sweeps over a desired frequency band. The horizontal deflection voltage of a cathode-ray tube CRT changes in response to a change in the voltage of the ramp generator 7. From the mixing results obtained in the mixer 3, a desired frequency is filtered in an adjustable band-pass filter 8, whereafter the signal frequency is further lowered in two successive mixer stages 9, 10 using fixed oscillator frequencies. The resolution band may thus be made narrower. After amplification carried out in a chain of switchable intermediate frequency amplifiers 11, band-pass filtering performed in a filter 12 with an adjustable pass band, and amplification carried out in an intermediate frequency amplifier 13, the signal is applied to a block 14 for performing a logarithmic conversion. In this block, detection is also performed. Combined component packages that carry out detection and logarithmic amplification are commercially available. Block 14 provides as an output the amplitude variation of the detected signal as a function of frequency and in accordance with the logarithmic scale. The vertical deflection voltage of the cathode-ray tube varies in response to the output of block 14, whereby the amplitude of the input signal is drawn on the tube as a function of frequency in the decibel scale.

In prior art spectrum analyzers, a video amplifier is employed. The name originates from a detector in which a logarithmic amplifier, that is, a chain of saturated amplifiers with a limiter output is used after or before envelope detection. The precision of a video amplifier of this kind is high, but its cost is high. An IF amplifier circuit with an RSSI (Received Signal Strength Indicator) circuit at the output may also be used. The advantage of amplifiers applying this solution is a low cost, but the drawback is low precision. The dynamic range that may be achieved with prior art analyzers is some 60 dB, which limits the uses of the analyzer. Furthermore, video amplifier circuits may be very costly depending on the qualities, and the variation between analyzers caused during the production is rather great, and adjustments of different kinds must thus be carried out for reducing the variation. The third drawback is caused by the fact that costly oscillator solutions, such as a YIG oscillator, must be used, since the requirements for the precision of an adjustable oscillator are high.

The object of this invention is to achieve a receiver for spectrum analysis, suited for analyzing a radio frequency signal, and to avoid the drawbacks of the prior art receivers. The object is specifically to measure the signal level as a function of frequency in a simple and reliable manner, without using a logarithmic amplification chain, and achieve a wide dynamic range, up to 100 dB.

The object is achieved with a spectrum analyzer comprising at least one mixer, a detector, an attenuator, a decoder, and a controller and recorder.

SUMMARY OF THE INVENTION

The receiver of the invention comprises an adjustable attenuator, a generator which generates a control signal to adjust its attenuation in response to the level of a detected signal so that the level of the detected signal remains unchanged, and a recorder which records the values of the control signal. In such a case, the values of the control signal represent amplitude values.

In accordance with a preferred embodiment, the receiver comprises a microprocessor in which the values of the control signal are recorded and which processes the values to be displayed on a display unit. The microprocessor may also calibrate the adjustable attenuator. It may also be informed if the signal exceeds the dynamic range, whereby the operation of the receiver continues in a predetermined manner.

In accordance with a preferred embodiment, the oscillator frequency is produced by a phase-locked loop, the division values of its dividers being provided by the microprocessor, whereby it is possible to generate the frequencies of the frequency range to be swept in desired frequency steps, and the frequency information, as well as the value of the attenuator control signal proportional to the amplitude value of the detected signal are recorded in the microprocessor.

BRIEF DESCRIPTION OF THE DRAWINGS

In the following, the invention will be disclosed in greater detail by means of a preferred embodiment of the invention with reference to the attached drawings, in which.

DETAILED DESCRIPTION OF THE INVENTION

Figure 1:
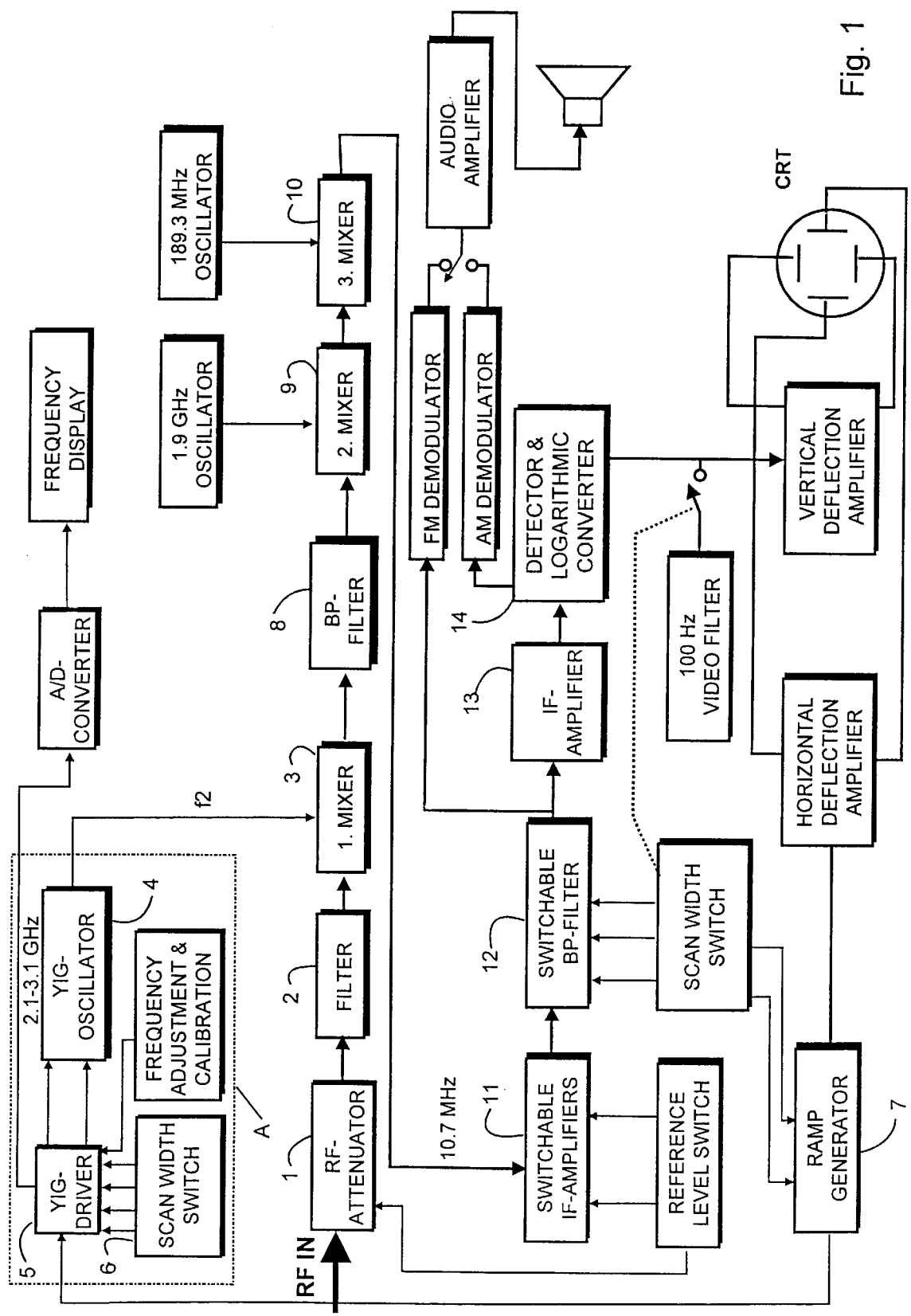
FIG. 1 shows a block diagram of a prior art receiver for spectrum analysis and FIG. 2 shows a block diagram of a receiver for spectrum analysis in accordance with the invention.
Figure 2:
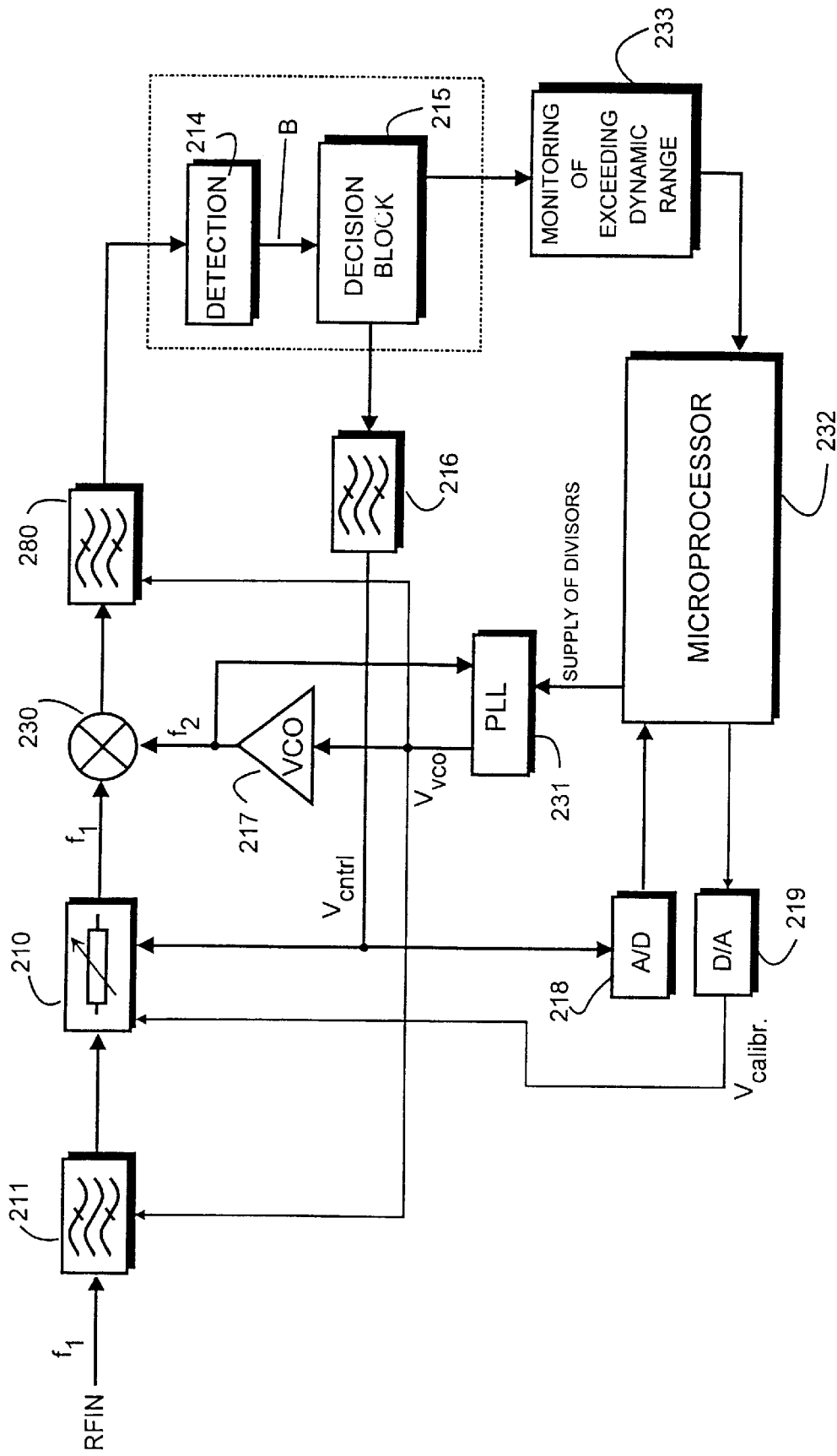

In the receiver of the invention, an incoming RF signal RFIN to be studied is mixed with the oscillator frequency $f_2$ in a mixer 230 onto the intermediate frequency of a band-pass filter 280, whereafter detection is carried out in a detector block 214 as shown in FIG. 2. There is no logarithmic amplifier after the detector as in prior art systems, and the level of the detected signal is studied in a detection block 215. An attenuator 210 attenuates or amplifies the input signal in response to the information provided by block 215 so that the level of the detected signal remains constant. The principle is similar to an Automatic Gain Control (AGC) applied in radio receivers.

When the oscillator frequency $f_2$ is swept over a desired band and the adjustment values of the attenuator 210 are recorded in the memory, it is easy to form a spectral curve in the display unit by processing the adjustment values since the adjustment values are proportional to amplitude values.

In the following, the operation of the receiver is to be discussed in more detail with reference to FIG. 2.

An RF signal to be measured, having a frequency $f_1$, enters a filter 211, which limits the useful bandwidth of the signal to be measured within the right range. Thereafter, the signal is attenuated or amplified in an adjustable attenuator 210 so that the level of the detected signal remains constant after detector 214 at point B. The adjustable attenuator 210 may be implemented in the form of a chain of PIN diodes or a commercially available attenuator microcircuit. An important requirement for the attenuator is that its attenuation in decibels, depends linearly on the control voltage $V_{CNTRL}$, i.e., the change V/dB is linear. A suitable change is, e.g., 1V/10 dB. For achieving the desired change in practice, it is necessary to use a number of attenuation stages, whereby the calibration voltage $V_{Calibr.}$ may be applied to one attenuation stage. The calibration voltage is obtained from a microprocessor 232 via a D/A converter 219 in a manner disclosed hereinafter.

The frequency $f_1$ of the signal to be measured, attenuated/amplified in the attenuator 210, is transferred onto a lower frequency by mixing it in the mixer 230 with a oscillator frequency $f_2$ signal, which is obtained from a voltage controlled oscillator 217. In accordance with a preferred embodiment, frequency $f_2$ is generated by a phase-locked loop PLL. The phase-locked loop includes the voltage controlled oscillator 217, a phase comparator, a loop filter, a reference oscillator, and dividers. Integrated circuits including the components, of the PLL circuits, are commercially available. As is generally known, a phase-locked loop forms a frequency synthesizer in a case where its divisors may be changed by software. The frequency to be synthesized with the loop, the oscillator frequency $f_2$, is determined by the microprocessor 232 by feeding suitable divisors to a programmable loop divider (not shown) of the PLL block 231. When the divisors are changed, the control voltage $V_{VCO}$ of VCO 217 changes, and the frequency generated by the VCO may be changed gradually over a desired frequency band. By generating the oscillator frequency with a phase-locked loop, excellent frequency precision and a remarkably lower price are achieved in the narrow frequency range used as compared with the YIG oscillator, for instance.

An intermediate frequency signal is filtered from the mixing results in a band-pass filter 280. The filter limits the resolution to be measured. A signal to be measured, after being transferred onto a lower frequency, is directed to the detector 214, the output of which provides the envelope of the signal. Thereafter, the detected signal is directed to a decision block 215, in which it is studied whether the level of the input signal is higher or lower than the values given at point B. If the level is higher or lower than the given values, the decision block 215 provides a control signal $V_{CNTRL}$, which commands the attenuator 210 via a low-pass filter 216 to attenuate or amplify the input signal RFIN so that it remains on the desired level at point B. The value of the control signal $V_{CNTRL}$ represents the position of the attenuator 210, and that is exactly the information desired, because the vertical deflection of the display unit (not shown) is controlled according to it. In other words, the dB value of the signal may easily be calculated based on the value on a specific frequency. If such an attenuator is used the attenuation of which measured in decibels depends linearly on the control voltage $V_{CNTRL}$, calculation is simple. The value of the control signal $V_{CNTRL}$, which is the desired information, is converted into a digital form in the A/D converter 218 and recorded in the microprocessor 232. The processor also has a corresponding frequency information owing to the fact that it has set the oscillator frequency by feeding the divisors into the phase-locked loop. Therefore, frequency information (X coordinates) and dB information on attenuation (Y coordinates) are recorded in the processor, and the spectrum may thus be displayed in the display unit either immediately or later. The recorded data may also be processed easily either in real-time or by post-processing.

The decision circuit 215 may be a comparator or an operational amplifier that compares the output of the envelope detector 214 with the reference level, or it may be an intermediate frequency circuit supplied with an RSSI detector, whereby the RSSI voltage of the circuit is maintained constant by adjusting the attenuator 210. A prior art filter used in spectrum analyzers may be used as a low-pass filter suitable for filtering the control voltage $V_{CNTRL}$, which filter narrows the noise bandwidth of the signal entering the display of the spectrum analyzer, in this case the noise bandwidth of the signal entering the A/D converter 218.

The decision circuit 215 also provides envelope information, which is applied to the comparator 233. When the level of the envelope exceeds a given reference level, the comparator 233 provides the microprocessor 232 with information the reference level has been exceeded, indicating that the dynamic range of the receiver has been exceeded, i.e., the signal to be measured goes beyond the measuring range. In response to this information, the microprocessor carries out a predetermined function, that is, it gives an alarm, for instance. It would also be possible to obtain the above-mentioned information from the control voltage information $V_{CNTRL}$, that is, the information that the attenuator is in its extreme position, and attenuation thus cannot be increased any more. It is remarkably faster, however, to act on the information provided by the envelope.

It is also possible to program a calibration table for the microprocessor 232. The table comprises loading information of a PLL circuit 231, that is, information on the frequencies generated by it, and information on the level error correction value, indicating how much the position of a calibration attenuator, which is a part of the attenuator 210, must be adjusted to achieve the correct value of the input level. Calibration control $V_{Calibr.}$ is converted into an analog form in the D/A converter 219 and applied to the attenuator 210.

Calibration is carried out in the manufacturing of the receiver on the production line. It is also possible to implement a receiver arrangement in which an input gate is automatically connected to a calibration generator, which may be a comb generator or a noise generator, and the microprocessor 232 carries out the calibration phase by studying the input level as a function of frequency, and produces correction values of the information.

If the filter 211 of the input signal of the receiver and/or the filter 280 of the mixing results are voltage-controlled filters, the control voltage $V_{VCO}$ of the VCO 217 may be used to adjust these filters, whereby the passband of the filters may be shifted in accordance with the signal frequency to be studied. This possibility is shown in FIG. 2 with control lines leading to the filters.

By a receiver for spectrum analysis of the invention, a simple and reliable measurement of the level of the signal is accomplished as a function of frequency without a costly logarithmic detector. It should be understood that the above explanation and the illustrations associated therewith are only intended to illustrate the present invention. Different variations and modifications of the invention will be obvious to persons skilled in the art without deviating from the scope and the spirit of the invention set forth in the attached claims. Therefore, the detector and the decision circuit may be combined into one commercially available circuit, such as an intermediate frequency circuit supplied with an RSSI circuit. This is illustrated in FIG. 2 with a broken line surrounding the detection and decision block. The microprocessor may also combine temperature calibration with the calibration signal. In the case of the example, there is only one mixer stage, but, by increasing the number of the mixer stages, it is possible to achieve very narrow resolution bands. It is also possible to employ direct mixing, whereby the band-pass filter 280 is replaced with a low-pass filter and an amplifier, that is, an active filter. The direct mixing is, however, attended by the drawback that since the frequency of the VCO is the same as that of the input signal, the frequency of the VCO may leak into the input gate RFIN. The attenuator may also be placed after the mixer at a suitable position prior to signal detection.

I claim:

1. A receiver for spectrum analysis, said receiver comprising:

at least one mixer, said mixer transferring a radio frequency input signal to be measured onto a lower frequency by mixing said input signal with an oscillator frequency generated by a voltage-controlled oscillator;

a detector which detects a level of said input signal, after said input signal has been transferred onto said lower frequency;

an attenuator, said input signal being an input to said attenuator;

a decider which provides, in response to a change in said level of said detected input signal, a control voltage, said control voltage being proportional to a magnitude and a direction of said change, said attenuator being adjustable, an adjustment voltage of said attenuator comprises said control voltage, said control voltage causing attenuation or amplification of an output signal of said attenuator so that said level of said detected input signal remains substantially constant, whereby control voltage information is proportional to said level of said input signal; and a controller and recorder which records and processes said control voltage information and oscillator frequency information.

2. The receiver as claimed in claim 1, wherein said decider comprises a comparer which compares said level of said detected input signal with a reference level and wherein said control voltage is proportional to a deviation of said level of said input signal from said reference level.

3. The receiver as claimed in claim 1, wherein said voltage-controlled oscillator is a part of a frequency synthesizer and wherein said controller and recorder directs said synthesizer to generate a desired oscillator frequency.

4. The receiver as claimed in claim 1, wherein said control voltage is directed to an A/D converter, whereby a digital value of said control voltage obtained from said A/D converter and directed to said controller and recorder is said control voltage information.

5. The receiver as claimed in claim 1, said receiver further comprising a monitor which monitors a dynamic range, said monitor notifying said controller and recorder when said level of said detected input signal exceeds a predetermined value.

6. The receiver as claimed in claim 1, wherein said adjustable attenuator comprises a plurality of adjustable attenuation stages, said controller and recorder adjusting attenuation of each of said stages by providing said stage with a calibration voltage.

7. The receiver as claimed in claim 3, wherein said control voltage of said voltage-controlled oscillator of said frequency synthesizer is an adjusting voltage for at least one adjustable filter of said receiver.

8. The receiver as claimed in claim 1, wherein said attenuation of said adjustable attenuator is measured in decibels and is linearly dependent on said control voltage.

9. The receiver as claimed in claim 1, wherein said controller and recorder is a microprocessor that processes said control voltage information and said oscillator frequency information so that an amplitude of said signal to be measured as a function of frequency may be displayed.

* * * * *